US006665202B2

(12) United States Patent
Lindahl et al.

(10) Patent No.: US 6,665,202 B2
(45) Date of Patent: Dec. 16, 2003

(54) CONTENT ADDRESSABLE MEMORY (CAM) DEVICES THAT CAN IDENTIFY HIGHEST PRIORITY MATCHES IN NON-SECTORED CAM ARRAYS AND METHODS OF OPERATING SAME

(75) Inventors: Craig A. Lindahl, McKinney, TX (US); Yong-Dong Zhao, Plano, TX (US); John R. Mick, Plano, TX (US)

(73) Assignee: Integrated Device Technology, Inc., Santa Clara, CA (US)

( * ) Notice: Subject to any disclaimer, the term of this patent is extended or adjusted under 35 U.S.C. 154(b) by 85 days.

(21) Appl. No.: 09/962,737

(22) Filed: Sep. 25, 2001

(65) Prior Publication Data

US 2003/0058671 A1 Mar. 27, 2003

(51) Int. Cl.[7] ............................................. G11C 15/00
(52) U.S. Cl. .................... 365/49; 365/189.07; 711/108
(58) Field of Search .................... 365/49, 194, 189.07, 365/230.01; 711/108

(56) References Cited

U.S. PATENT DOCUMENTS

| 5,329,405 | A | | 7/1994 | Hou et al. |
| 5,706,224 | A | | 1/1998 | Srinivasan et al. |
| 5,852,569 | A | | 12/1998 | Srinivasan et al. |
| 5,920,886 | A | | 7/1999 | Feldmeier |
| 5,964,857 | A | | 10/1999 | Srinivasan et al. |
| 6,101,116 | A | | 8/2000 | Lien et al. |
| 6,108,227 | A | * | 8/2000 | Voelkel ........................ 365/49 |
| 6,128,207 | A | | 10/2000 | Lien et al. |
| 6,144,574 | A | | 11/2000 | Kobayashi et al. |
| 6,237,061 | B1 | | 5/2001 | Srinivasan et al. |
| 6,256,216 | B1 | | 7/2001 | Lien et al. |
| 6,266,262 | B1 | | 7/2001 | Washburn et al. |
| 6,307,855 | B1 | | 10/2001 | Hariguchi |
| 6,353,873 | B1 | | 3/2002 | Melchior |
| 6,370,613 | B1 | | 4/2002 | Diede et al. |
| 6,374,326 | B1 | | 4/2002 | Kansai et al. |
| 6,415,354 | B1 | | 7/2002 | Joffe et al. |
| 6,460,112 | B1 | | 10/2002 | Srinivasan et al. |
| 6,499,081 | B1 | | 12/2002 | Nataraj et al. ............... 711/108 |
| 6,502,163 | B1 | * | 12/2002 | Ramankutty ................. 711/108 |
| 6,505,270 | B1 | * | 1/2003 | Voelkel et al. ............... 711/108 |
| 6,535,410 | B2 | | 3/2003 | Yanagawa ..................... 365/49 |
| 6,542,392 | B2 | | 4/2003 | Yanagawa ..................... 365/49 |
| 2002/0131432 | A1 | * | 9/2002 | Bachmutsky et al. ........ 370/408 |
| 2003/0028713 | A1 | * | 2/2003 | Khanna et al. .............. 711/108 |

FOREIGN PATENT DOCUMENTS

| EP | 1 018 824 A2 | 7/2000 |
| WO | WO 01/05116 A3 | 1/2001 |
| WO | WO 01/05116 A2 | 1/2001 |
| WO | WO 01/43370 A2 | 6/2001 |

* cited by examiner

*Primary Examiner*—Richard Elms
*Assistant Examiner*—Toan Le

(57) ABSTRACT

Content addressable memory (CAM) devices include CAM arrays that can identify a best match(es) from a plurality of matches when an operation to compare data applied to a CAM array against data entries within the CAM array is performed. This best match identification operation is preferably performed internal to the CAM array. The best match identification operation does not require operations to determine a highest priority match based on the relative physical locations of multiple matching entries that might be identified within the CAM array during a compare operation. The CAM device also does not require that the CAM array(s) therein be sectored into groups of entry locations (e.g., rows) having ordered priorities or that each CAM array within a multi-array CAM device be treated as a respective sector. Entries having identical priority may be entries having the same number of actively masked bits therein.

17 Claims, 8 Drawing Sheets

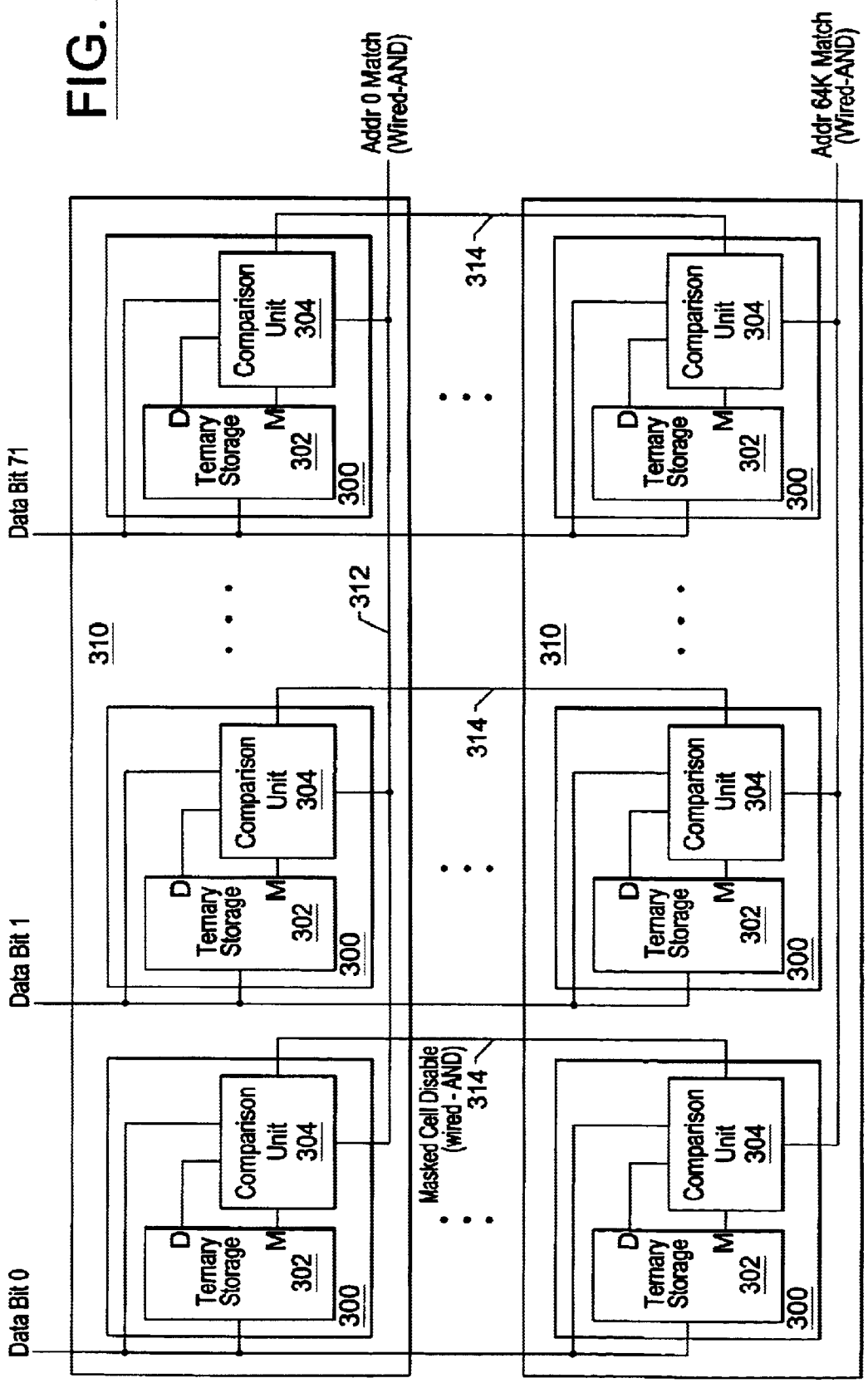

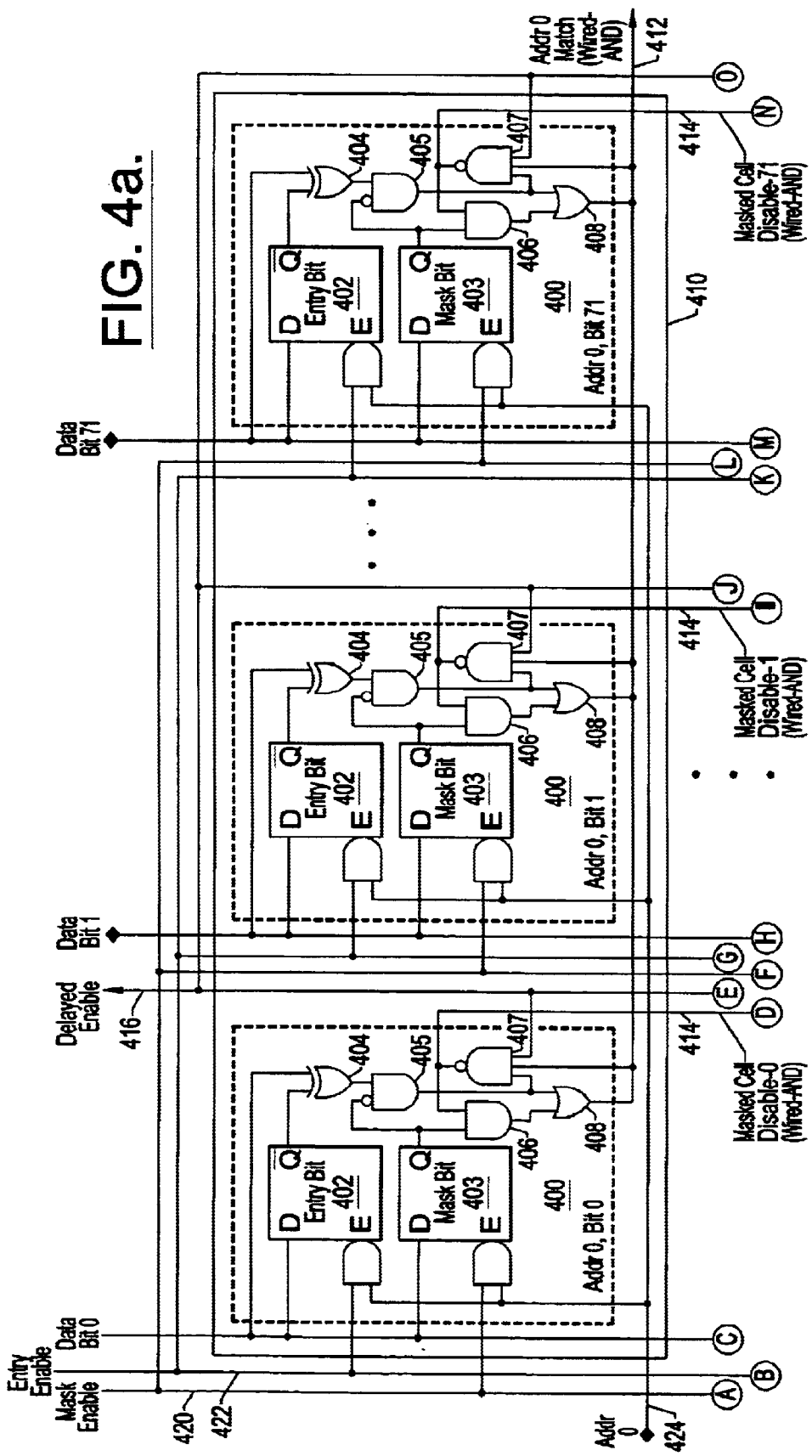

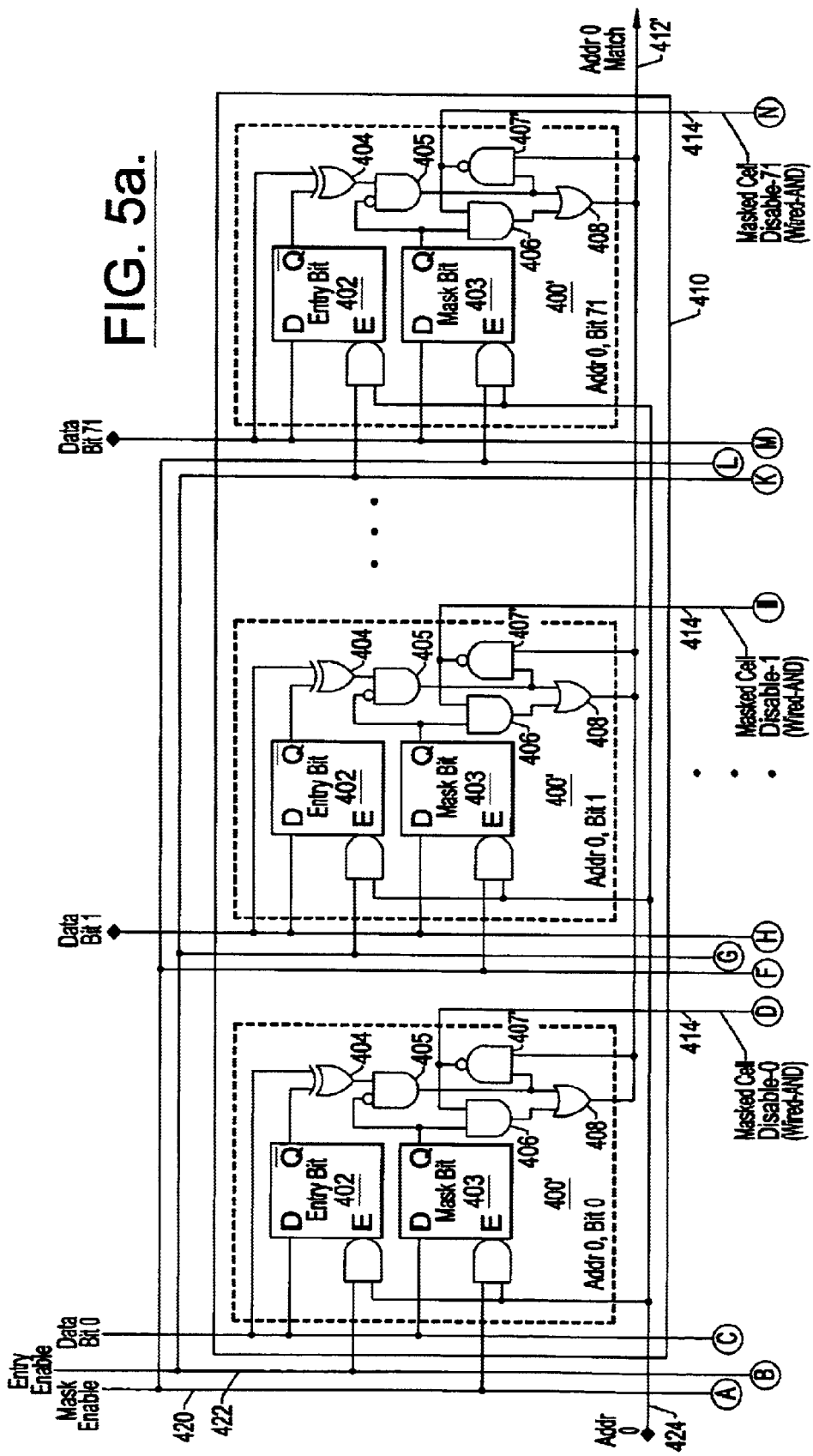

PHASE 1 - IDENTIFY MATCHES

| APPLIED DATA | 1 | 1 | 1 | 0 | 1 | 0 | 1 | 1 | 0 | 0 | 1 | 0 | 1 | 1 | 1 | 0 | |
|---|---|---|---|---|---|---|---|---|---|---|---|---|---|---|---|---|---|
| COLUMN | 15 | 14 | 13 | 12 | 11 | 10 | 9 | 8 | 7 | 6 | 5 | 4 | 3 | 2 | 1 | 0 | |
| ROW 0 | 0 | 1 | 1 | 0 | 1 | 0 | 1 | 1 | 0 | 0 | 1 | 0 | 1 | 1 | 1 | 0 | MISS |
| 1 | X | 1 | 0 | 1 | 1 | 0 | 1 | 1 | 0 | 0 | 1 | 0 | 1 | 1 | 1 | 0 | MISS |
| 2 | X | X | 0 | 1 | 1 | 0 | 1 | 1 | 0 | 0 | 1 | 0 | 1 | 1 | 1 | 0 | MISS |
| 3 | X | X | 0 | 1 | 1 | 0 | 1 | X | 0 | 0 | 1 | 0 | 1 | 1 | 1 | 1 | MISS |
| 4 | X | 1 | 0 | 1 | 1 | 0 | 1 | 1 | 0 | 0 | 1 | 0 | 1 | 1 | 1 | 0 | MISS |
| 5 | X | X | 0 | 1 | 1 | 0 | 1 | X | X | 0 | 1 | X | X | X | 1 | 0 | MISS |
| 6 | X | X | 0 | 1 | 1 | 0 | 1 | X | 0 | 0 | 1 | 0 | 1 | 1 | 1 | 0 | MISS |
| 7 | X | 1 | 0 | 1 | 1 | 1 | 1 | 0 | 1 | 0 | 1 | 0 | 1 | 1 | 1 | 1 | MISS |
| 8 | X | X | 1 | 0 | 1 | 0 | 1 | X | X | 0 | 1 | X | X | X | X | X | MATCH |
| 9 | X | X | 1 | 1 | 1 | 0 | 1 | X | 1 | 0 | 0 | 0 | 0 | 0 | 0 | 1 | MISS |
| 10 | X | X | 1 | 0 | 1 | 0 | 1 | X | X | 0 | 1 | X | 1 | 1 | 1 | 0 | MATCH |
| 11 | X | 1 | 0 | 1 | 1 | 0 | 1 | 0 | 1 | 0 | 0 | 1 | 1 | 1 | 1 | 0 | MISS |

PHASE 2 - SELECT BEST MATCH(ES) FROM IDENTIFIED MATCHES

| APPLIED DATA | 1 | 1 | 1 | 0 | 1 | 0 | 1 | 1 | 0 | 0 | 1 | 0 | 1 | 1 | 1 | 0 | |
|---|---|---|---|---|---|---|---|---|---|---|---|---|---|---|---|---|---|
| COLUMN | 15 | 14 | 13 | 12 | 11 | 10 | 9 | 8 | 7 | 6 | 5 | 4 | 3 | 2 | 1 | 0 | |
| ROW 0 | 0 | 1 | 1 | 0 | 1 | 0 | 1 | 1 | 0 | 0 | 1 | 0 | 1 | 1 | 1 | 0 | MISS |
| 1 | X | 1 | 0 | 1 | 1 | 0 | 1 | 1 | 0 | 0 | 1 | 0 | 1 | 1 | 1 | 0 | MISS |
| 2 | X | X | 0 | 1 | 1 | 0 | 1 | 1 | 0 | 0 | 1 | 0 | 1 | 1 | 1 | 0 | MISS |
| 3 | X | X | 0 | 1 | 1 | 0 | 1 | X | 0 | 0 | 1 | 0 | 1 | 1 | 1 | 1 | MISS |
| 4 | X | 1 | 0 | 1 | 1 | 0 | 1 | 1 | 0 | 0 | 1 | 0 | 1 | 1 | 1 | 0 | MISS |
| 5 | X | X | 0 | 1 | 1 | 0 | 1 | X | X | 0 | 1 | X | X | X | 1 | 0 | MISS |
| 6 | X | X | 0 | 1 | 1 | 0 | 1 | X | 0 | 0 | 1 | 0 | 1 | 1 | 1 | 0 | MISS |
| 7 | X | 1 | 0 | 1 | 1 | 1 | 1 | 0 | 1 | 0 | 1 | 0 | 1 | 1 | 1 | 1 | MISS |
| 8 | X | X | 1 | 0 | 1 | 0 | 1 | X | X | 0 | 1 | X | X | X | X | X | MISS |
| 9 | X | X | 1 | 1 | 1 | 0 | 1 | X | 1 | 0 | 0 | 0 | 0 | 0 | 0 | 1 | MISS |
| 10 | X | X | 1 | 0 | 1 | 0 | 1 | X | X | 0 | 1 | X | 1 | 1 | 1 | 0 | BEST MATCH |
| 11 | X | 1 | 0 | 1 | 1 | 0 | 1 | 0 | 1 | 0 | 0 | 1 | 1 | 1 | 1 | 0 | MISS |

FIG. 6.

| APPLIED DATA | 1 | 1 | 1 | 0 | 1 | 0 | 1 | 1 | 0 | 0 | 1 | 0 | 1 | 1 | 1 | 0 | |
|---|---|---|---|---|---|---|---|---|---|---|---|---|---|---|---|---|---|
| COLUMN | 15 | 14 | 13 | 12 | 11 | 10 | 9 | 8 | 7 | 6 | 5 | 4 | 3 | 2 | 1 | 0 | |
| ROW 0 | 0 | 1 | 1 | 0 | 1 | 0 | 1 | 1 | 0 | 0 | 1 | 0 | 1 | 1 | 1 | 0 | MISS |
| 1 | 0 | 1 | 0 | 1 | 1 | 0 | 1 | 1 | 0 | 0 | 1 | 0 | 1 | 1 | 1 | X | MISS |
| 2 | 0 | 1 | 0 | 1 | 1 | 0 | 1 | 1 | 0 | 0 | 1 | 0 | 1 | 1 | X | X | MISS |
| 3 | 0 | 1 | 0 | 1 | 1 | 0 | 1 | 0 | 0 | 0 | 1 | 0 | 1 | 1 | X | X | MISS |
| 4 | 0 | 1 | 0 | 1 | 1 | 0 | 1 | 1 | 0 | 0 | 1 | 0 | 1 | 1 | 1 | X | MISS |
| 5 | 1 | 0 | 0 | 1 | 1 | 0 | 1 | 0 | 1 | 0 | 1 | 0 | 1 | 1 | X | X | MISS |
| 6 | 1 | 0 | 0 | 1 | 1 | 0 | 1 | 0 | 0 | 0 | 1 | 0 | 1 | 1 | X | X | MISS |
| 7 | 0 | 1 | 0 | 1 | 1 | 1 | 1 | 0 | 1 | 0 | 1 | 0 | 1 | 1 | 1 | X | MISS |
| 8 | 1 | 1 | 1 | 0 | 1 | 0 | 1 | 1 | 0 | 0 | 1 | 0 | X | X | X | X | MATCH |
| 9 | 1 | 0 | 1 | 1 | 1 | 0 | 1 | 0 | 1 | 0 | 0 | 0 | 0 | 0 | X | X | MISS |
| 10 | 1 | 1 | 1 | 0 | 1 | 0 | 1 | 1 | 0 | 0 | 1 | 0 | 1 | 1 | X | X | MATCH |
| 11 | 0 | 1 | 0 | 1 | 1 | 0 | 1 | 0 | 1 | 0 | 0 | 1 | 1 | 1 | 1 | X | MISS |

PHASE 1 - IDENTIFY MATCHES

| APPLIED DATA | 1 | 1 | 1 | 0 | 1 | 0 | 1 | 1 | 0 | 0 | 1 | 0 | 1 | 1 | 1 | 0 | |
|---|---|---|---|---|---|---|---|---|---|---|---|---|---|---|---|---|---|
| COLUMN | 15 | 14 | 13 | 12 | 11 | 10 | 9 | 8 | 7 | 6 | 5 | 4 | 3 | 2 | 1 | 0 | |
| ROW 0 | 0 | 1 | 1 | 0 | 1 | 0 | 1 | 1 | 0 | 0 | 1 | 0 | 1 | 1 | 1 | 0 | MISS |
| 1 | 0 | 1 | 0 | 1 | 1 | 0 | 1 | 1 | 0 | 0 | 1 | 0 | 1 | 1 | 1 | X | MISS |
| 2 | 0 | 1 | 0 | 1 | 1 | 0 | 1 | 1 | 0 | 0 | 1 | 0 | 1 | 1 | X | X | MISS |
| 3 | 0 | 1 | 0 | 1 | 1 | 0 | 1 | 0 | 0 | 0 | 1 | 0 | 1 | 1 | X | X | MISS |
| 4 | 0 | 1 | 0 | 1 | 1 | 0 | 1 | 1 | 0 | 0 | 1 | 0 | 1 | 1 | 1 | X | MISS |
| 5 | 1 | 0 | 0 | 1 | 1 | 0 | 1 | 0 | 1 | 0 | 1 | 0 | 1 | 1 | X | X | MISS |
| 6 | 1 | 0 | 0 | 1 | 1 | 0 | 1 | 0 | 0 | 0 | 1 | 0 | 1 | 1 | X | X | MISS |
| 7 | 0 | 1 | 0 | 1 | 1 | 1 | 1 | 0 | 1 | 0 | 1 | 0 | 1 | 1 | 1 | X | MISS |
| 8 | 1 | 1 | 1 | 0 | 1 | 0 | 1 | 1 | 0 | 0 | 1 | 0 | X | X | X | X | MISS |
| 9 | 1 | 0 | 1 | 1 | 1 | 0 | 1 | 0 | 1 | 0 | 0 | 0 | 0 | 0 | X | X | MISS |
| 10 | 1 | 1 | 1 | 0 | 1 | 0 | 1 | 1 | 0 | 0 | 1 | 0 | 1 | 1 | X | X | LONGEST PREFIX MATCH |
| 11 | 0 | 1 | 0 | 1 | 1 | 0 | 1 | 0 | 1 | 0 | 0 | 1 | 1 | 1 | 1 | X | MISS |

PHASE 2 - SELECT LONGEST PREFIX MATCH FROM IDENTIFIED MATCHES

FIG. 7.

CONTENT ADDRESSABLE MEMORY (CAM) DEVICES THAT CAN IDENTIFY HIGHEST PRIORITY MATCHES IN NON-SECTORED CAM ARRAYS AND METHODS OF OPERATING SAME

FIELD OF THE INVENTION

The present invention relates to integrated circuit memory devices and, more particularly, to content addressable memory (CAM) devices and methods of operating same.

BACKGROUND OF THE INVENTION

In many memory devices, including random access memory (RAM) devices, data is typically accessed by supplying an address to an array of memory cells and then reading data from the memory cells that reside at the supplied address. However, in content addressable memory (CAM) devices, data within a CAM array is not accessed by initially supplying an address, but rather by initially applying data to the array and then performing a compare operation to identify one or more locations within the array that contain data equivalent to the applied data and thereby represent a "match" condition. In this manner, data is accessed according to its content rather than its address. Upon completion of the compare operation, the identified location(s) containing equivalent data is typically encoded to provide an address at which the equivalent data is located. If multiple locations are identified in response to the compare operation, then priority encoding operations may be performed to identify a best or highest priority match. Such priority encoding operations frequently utilize the physical locations of multiple matches within the CAM array to identify a highest priority match. Exemplary CAM cells and CAM memory devices are more fully described in U.S. Pat. Nos. 5,706,224, 5,852,569 and 5,964,857 to Srinivasan et al. and U.S. Pat. Nos. 6,101,116, 6,256,216 and 6,128,207 to Lien et al., assigned to the present assignee, the disclosures of which are hereby incorporated herein by reference.

CAM cells are frequently configured as binary CAM cells that store only data bits (as "1" or "0" logic values) or as ternary CAM cells that store data bits and mask bits. As will be understood by those skilled in the art, when a mask bit within a ternary CAM cell is inactive (e.g., set to a logic 0 value), the ternary CAM cell may operate as a conventional binary CAM cell storing an "unmasked" data bit. When the mask bit is active (e.g., set to a logic 1 value), the ternary CAM cell is treated as storing a "don't care" (X) value, which means that all compare operations performed on the actively masked ternary CAM cell will result in a cell match condition regardless of the value of the applied data bit versus the stored data bit. Thus, if a logic 0 data bit is applied to a ternary CAM cell storing an active mask bit and a logic 1 data bit, the compare operation will indicate a cell match condition. A cell match condition will also be indicated if a logic 1 data bit is applied to a ternary CAM cell storing an active mask bit and a logic 0 data bit. Accordingly, if a data word of length N, where N is an integer, is applied to a ternary CAM array having a plurality of entries therein of width N, then a compare operation will yield one or more entry match conditions whenever all the unmasked data bits of a word stored in the ternary CAM array are identical to the corresponding data bits of the applied word. This means that if the applied data word equals {1011}, the following stored words will result in an entry match condition in a CAM comprising ternary CAM cells (i.e., a ternary CAM): {1011}, {X011}, {1X11}, {10X1}, {101X}, {XX11}, {1XX1}, ..., {1XXX}, {XXXX}.

Applications using CAMs include database management, disk caching, pattern and image recognition and artificial intelligence. CAMs are also well suited for use in routing network traffic, such as in network address lookup or packet switching. For example, FIG. 1 illustrates a simplified view of a network switch 100. The network switch 100 may communicate with a network through a plurality of network ports, shown as ports zero (0) through seven (7). The switch 100 may receive network traffic on one port and determine to which of its other ports that traffic should be routed. As will be understood by those skilled in the art, the network traffic may include a packet stream of data containing a leading destination address. The network switch 100 may select a leading portion of the packet stream and provide it to a ternary CAM 102. The CAM 102 may contain entries that include predetermined routing information, with the CAM address of each of these entries designating a port of the network switch 100. When the portion of the packet stream is applied as data to the CAM 102 during a compare operation, the CAM 102 may return a CAM address. This CAM address may correspond to the location of an entry within the CAM 102 that matches the applied portion of the packet stream. This returned CAM address may then be used by the network switch 100 to direct the packet stream to a desired port that will enable the packet stream to reach its destination address.

Referring now to FIG. 2, a conventional network routing application may also utilize a switch controller 200 that receives network packets from an external source and routes the network packets through a switch 206. The switch controller 200 may provide a portion of a destination address within a packet to an accompanying CAM 202. In response, the CAM 202 may perform a compare operation and generate an address of a matching entry. This generated address may be used as a pointer to acquire network address translation information or other routing information contained within a RAM 204. The information provided by the RAM is then conveyed to the controller 200 for use in routing the packet through the switch 206. In this manner, a CAM 202 may be used to provide a mechanism for locating address translation and routing information for network packet addresses.

In the event multiple matches (i.e., multiple matching entries) are detected during a compare operation, conventional physical priority encoding techniques may be utilized to identify a best or highest priority match (i.e., a highest priority matching entry) that should be used to perform the routing of the packet stream in a preferred manner. This highest priority match is frequently referred to as a longest prefix match (LPM), where the prefix may be defined as a first portion of a network packet address. A conventional technique for identifying an LPM will now be described with reference to the entries illustrated within the CAM 102 of FIG. 1. If the destination address within the packet stream is a bit sequence equal to {01100010}, then a compare operation within the CAM 102 of FIG. 1 will result in three (3) matches. These three matches correspond to the entries at address 0, designating port 0, address 3, designating port 3, and address 6, designating port 6. As illustrated by the entries within the CAM 102, the match corresponding to the entry at address 0 may be treated as the highest priority match because it is the entry with the largest number of unmasked data bits that are equivalent to the applied destination address. The detection of this highest priority match can be relatively simple if the entries within the CAM 102 are presorted according to priority or are arranged within sectors, with each sector containing entries having the same number of unmasked bits and being physically arranged according to priority. As described herein, sectors within a CAM may have the same or different number of entries therein.

As illustrated by FIG. 1, entries having no masked bits may be stored in a first sector (illustrated as spanning addresses 0–2 within the CAM 102) and entries having only one (1) masked bit may be stored in a second sector (illustrated as spanning only address 3 within the CAM 102). Entries having a greater number of masked bits are also stored in respective lower priority sectors within the CAM 102. By intentionally arranging all entries having the same number of masked bits within the same sector and by physically locating the sectors in order of their priority within the CAM 102, a simple physical encoding technique may be used to identify the highest priority match as the match having the highest number of unmasked bits relative to the other matches. This technique typically includes selecting the match that is in the highest relative priority sector in the event matches within multiple sectors are present. If multiple matches are present within the same highest relative priority sector, then any of the equivalent matches may be selected as the "best" match.

U.S. Pat. No. 6,237,061 to Srinivasan et al., entitled "Method For Longest Prefix Matching in a Content Addressable Memory," discloses a similar arrangement of locally masked entries that need not be stored in equivalently sized sectors or blocks within a CAM, but nonetheless are stored by loading a plurality of Class-less Inter-Domain Routing (CIDR) addresses into respective ones of a plurality of CAM entries in a predetermined order such that increasing numerical CAM entry addresses correspond to CIDR addresses having decreasing prefix values (i.e., a greater number of actively masked bits). If a compare operation is then performed and a matching entry within the preordered CAM is present, a suitable match flag signal is asserted, and the index of the matching CAM entry (as well as any associated routing data stored in the CAM or in an external memory such as an SRAM array) is provided as an output. Alternatively, if there are multiple matching entries in the CAM, a suitable multiple match flag signal is asserted and, in response thereto, an associated priority encoder that is coupled to the CAM outputs the highest priority location. This highest priority location corresponds to the CAM entry having the lowest index, which by definition is the longest prefix matching entry.

Partitioning a CAM into a plurality of prioritized sectors may limit the flexibility of the CAM because the content of the CAM may need to be presorted into appropriate sectors according to mask length. Because the sectors are frequently partitioned into arrays of equal size to accommodate a variety of different applications, and because the number of entries required in each sector may be constantly changing during operation, it may not be possible to partition a CAM into fixed sized sectors that do not result in a significant number of unused entry locations. For example, if a CAM is divided into 16 equal sectors in order to support entries having as many as 15 actively masked bits and each sector is the same size, then much of the CAM may go unused if many of the sectors are only partially filled with entries of a respective mask length. Furthermore, it may not be practical to divide a CAM array into more than a relatively small number M of equally sized sectors because the size of each sector scales as 1/M, some applications may require a large number of priority levels (i.e., large M) and the number of entries at a given priority level may exceed H/M, where H is the height of the CAM (e.g., total number of rows in the CAM array). Finally, even if the CAM is not arranged into equivalently sized sectors, the loading of entries into the CAM in a predetermined order, such that increasing (or decreasing) CAM entry addresses correspond to entries having decreasing (or increasing) prefix values, may require time consuming operations to reload the CAM be performed when new entries having different prefix values are added to the CAM.

Thus, notwithstanding the relative simplicity of determining highest priority matches using conventional physical priority encoding techniques, additional techniques are needed that do not require presorting of entries and do not result in significant amounts of unused CAM space.

SUMMARY OF THE INVENTION

Content addressable memory (CAM) devices according to a first embodiment of the present invention include CAM arrays that can identify a best match(es) from a plurality of matches when an operation to compare data applied to a CAM array against data entries within the CAM array is performed. This best match identification operation is preferably performed internal to the CAM array. The best match identification operation does not require operations to determine a highest priority match based on the relative physical locations of multiple matching entries that might be identified within the CAM array during a compare operation. Accordingly, a CAM device that incorporates the first embodiment of the present invention may not require that the CAM array(s) therein be sectored into groups of entry locations (e.g., rows) having ordered priorities or that each CAM array within a multi-array CAM device be treated as a respective sector. Nonetheless, the entries within the CAM array that contain at least one actively masked bit preferably meet a masked bit location (MBL) constraint. This constraint requires that for every individual entry in a CAM array having at least one actively masked bit, all other entries in the same searchable CAM array having the same or fewer number of actively masked bits have each of their actively masked bit(s) in a respective location that overlaps a location of an actively masked bit in the individual entry.

A preferred CAM device may include an array of memory cells arranged as a plurality of rows of memory cells and a plurality of columns of memory cells that are electrically coupled to a respective plurality of data lines. Preferably integrated within the memory cell array is a data comparison circuit that identifies a longest prefix match (LPM) between data bits applied to the data lines and data bits (along with mask bits) that are randomly stored on a row basis in the plurality of rows of memory cells. CAM entries need not be grouped according to priority within respective sectors. The data comparison circuit preferably includes a plurality of comparison units that are associated with corresponding memory cells in the memory cell array, with each comparison unit and corresponding memory cell collectively forming a respective novel CAM cell in a CAM array.

The data comparison circuit may identify a longest prefix match in two phases during a single compare operation by identifying a first plurality of matches between the applied data bits and data bits stored with or without active mask bits as entries within the CAM array and then eliminating one or more of the first plurality of matches that do not represent a longest prefix match. This elimination phase of the compare operation may be performed in-sync with a leading edge of a delayed enable signal that may be asserted a predetermined amount of time after new data is applied to the CAM array. This operation to eliminate one or more of the first plurality of matches may include blocking at least one CAM cell associated with an identified match from indicating a cell match condition. According to a preferred aspect of this embodiment, the data comparison circuit identifies a longest prefix match by blocking at least one actively masked CAM cell, in an entry having all unmasked data bits that are equivalent to corresponding data bits applied to the data lines (i.e., a matching entry), from indicating a cell match condition. In particular, the data comparison circuit may force the actively masked CAM cell associated with a matching entry to indicate a cell miss during a compare operation, irrespective of whether the CAM cell is actually storing a matching data bit. According to another aspect of this embodiment, the data comparison circuit is not responsive to a delayed enable signal and the compare operation is not performed in two distinct phases.

According to another embodiment of the present invention, a CAM device includes a CAM array having circuitry therein that preferably identifies a best match between data applied to the CAM array and data entries within the CAM array. This identification operation is performed by blocking at least one actively masked CAM cell in a row within the CAM array from indicating a cell match condition during a compare operation, even when all other unmasked CAM cells in the same row are indicating cell matches with the applied data. This operation to block the at least one actively masked CAM cell preferably includes causing the at least one actively masked CAM cell to indicate a cell miss even when a data bit within the at least one actively masked CAM cell matches the corresponding bit within the applied data. These operations can be performed by a CAM array during a compare operation to block a matching entry having actively masked bits from indicating a match whenever another matching entry having a lesser number of actively masked bits is present.

BRIEF DESCRIPTION OF THE DRAWINGS

FIG. 3 is a block diagram of a content addressable memory (CAM) array according to a first embodiment of the present invention.

FIG. 6 illustrates preferred methods of identifying best matches in two phases during a compare operation.

FIG. 7 illustrates preferred methods of identifying longest prefix matches (LPM) in two phases during a compare operation.

Figure 1:
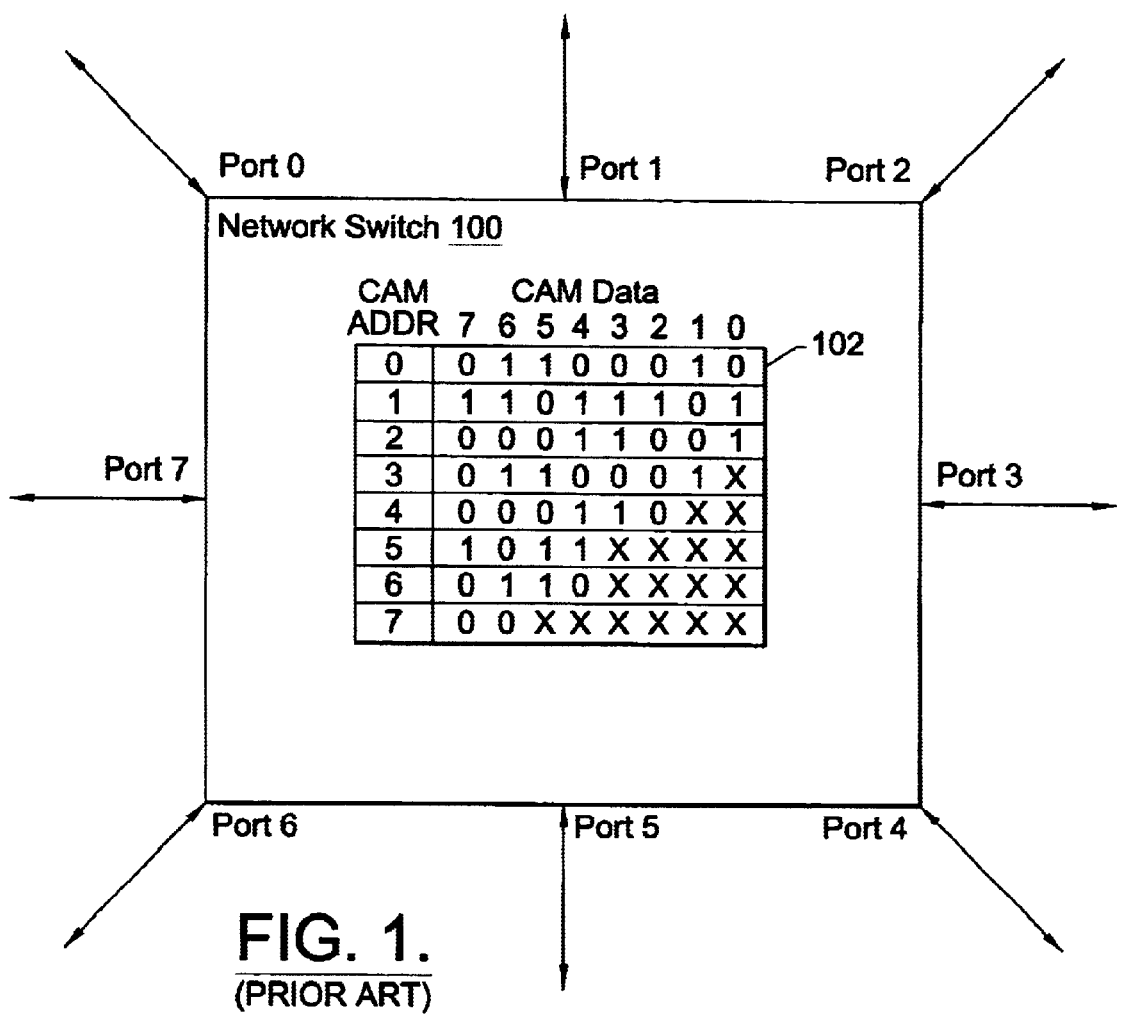
FIG. 1 is a block diagram of a network switch according to the prior art.
Figure 2:
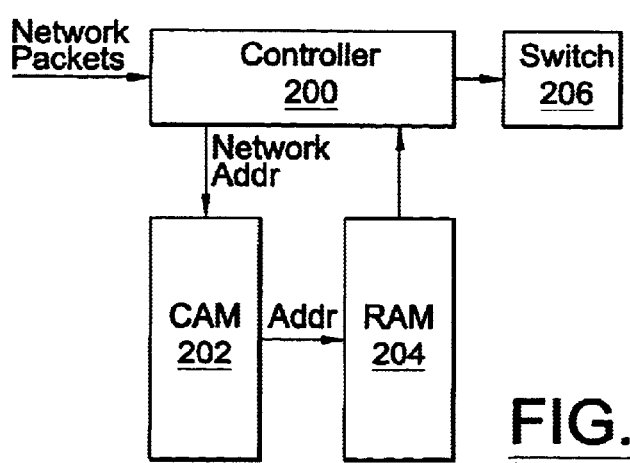
FIG. 2 is a block diagram of a network routing system according to the prior art.

DESCRIPTION OF PREFERRED
EMBODIMENTS

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout and signal lines and signals thereon may be referred to by the same reference characters.

Figure 4B:
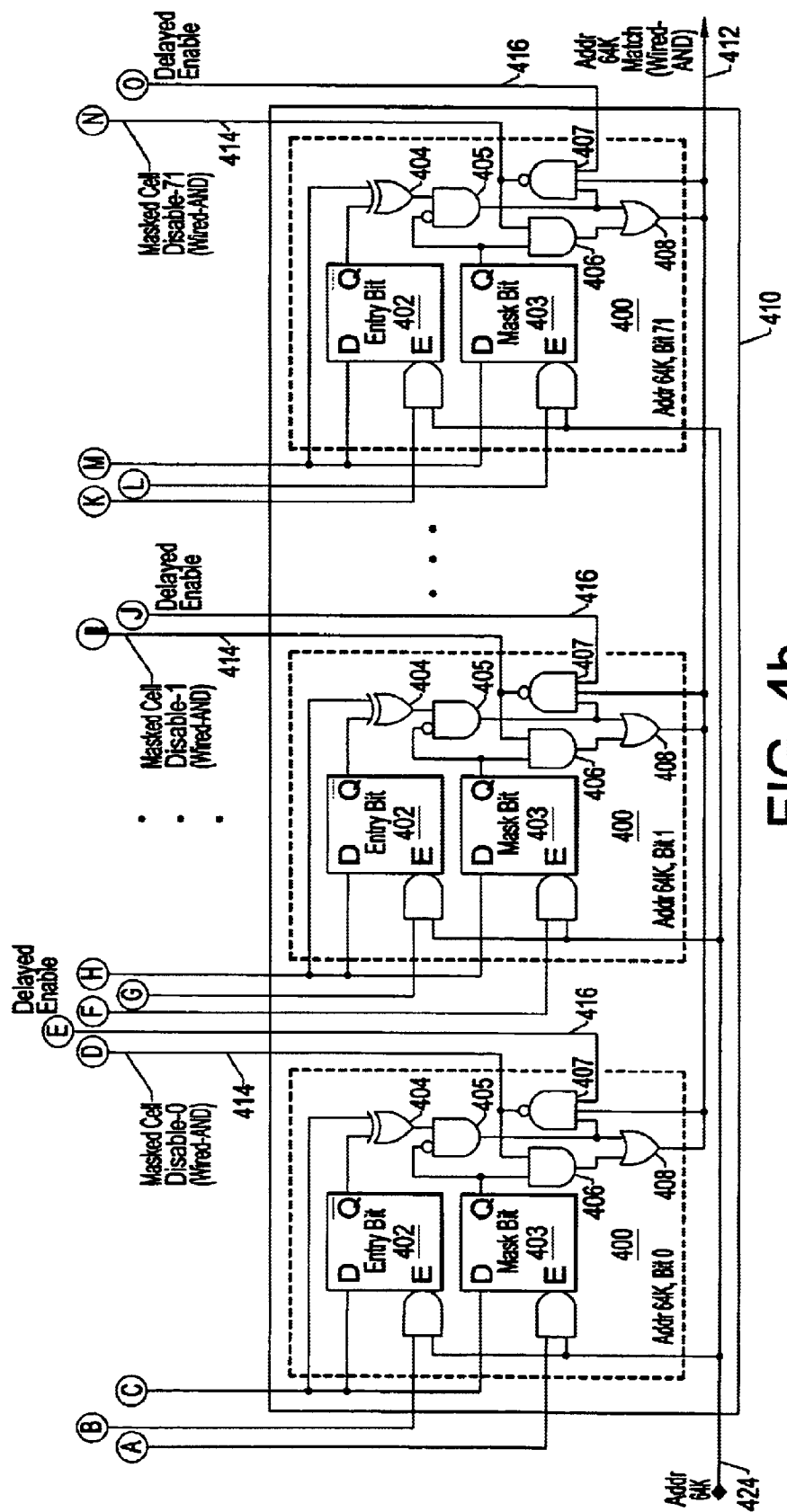
FIG. 4 is an electrical schematic of a content addressable memory (CAM) array according to a second embodiment of the present invention.
Figure 5B:
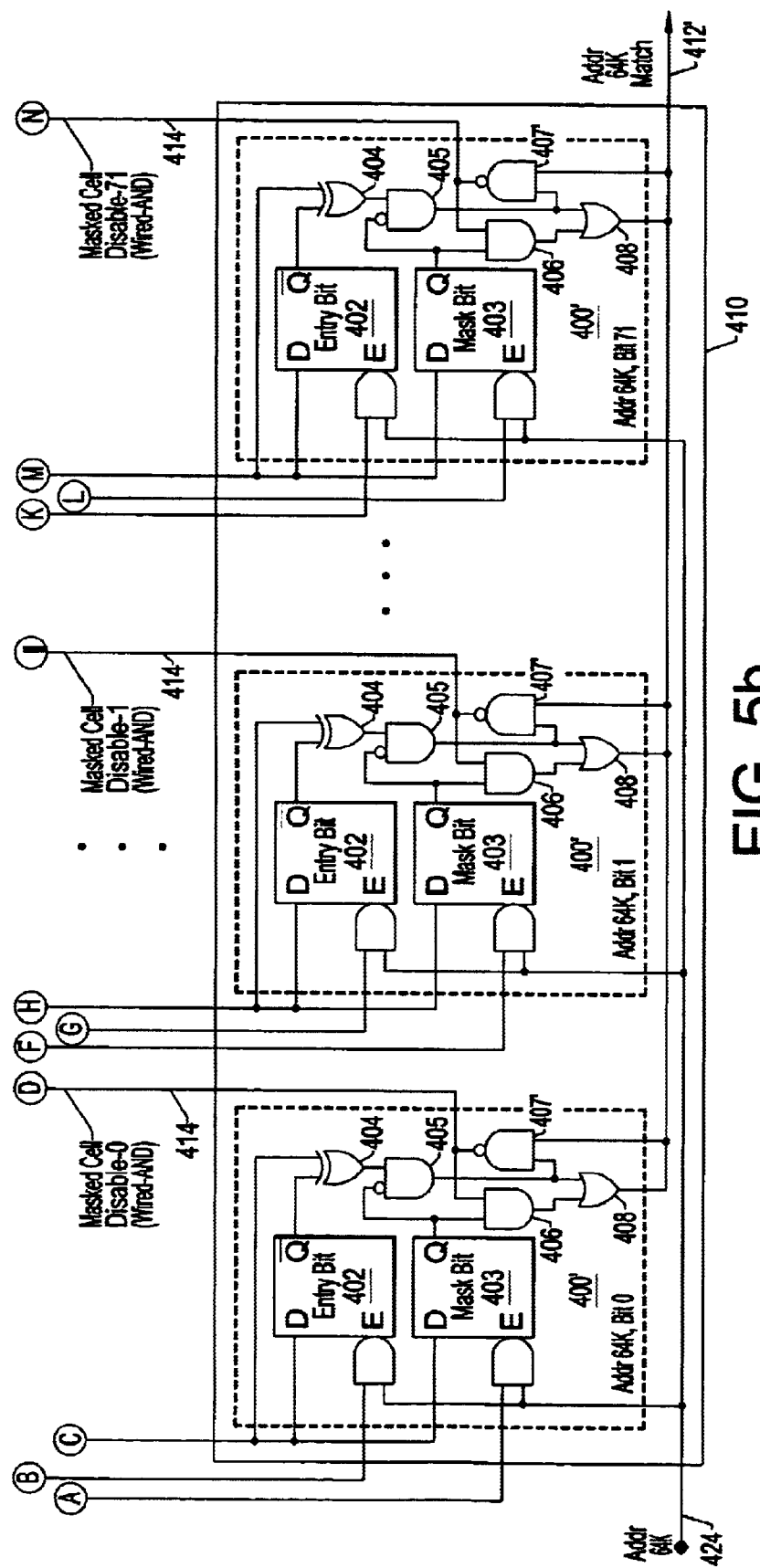
FIG. 5 is an electrical schematic of a content addressable memory (CAM) array according to a third embodiment of the present invention.

Content addressable memory (CAM) devices according to embodiments of the present invention may include the preferred CAM arrays of FIGS. 3–5. These CAM arrays operate to identify a best match(es) from a plurality of matches when an operation to compare data applied to the CAM array against data entries within the CAM array is performed. The operations to identify a best match preferably do not require operations to determine a highest priority match based on the relative physical locations of multiple matching entries that might be identified within the CAM array during a compare operation. Accordingly, CAM devices according to embodiments of the present invention need not require the use of CAM arrays that are sectored into groups of entry locations (e.g., rows) having-ordered priorities, or are treated as single sectors within a multi-array CAM device. These CAM arrays may be efficiently designed to identify best matches by subjecting operations to write new entries into the CAM array according to a preferred masked bit location (MBL) constraint that is column (not row) based. This MBL constraint may be achieved if, for every new entry having at least one actively masked bit, any and all other searchable entries in the CAM array that have the same or fewer number of actively masked bits have each of their actively masked bits in a location (e.g., column) that overlaps a location of an actively masked bit in the new entry. Based on this MBL constraint, entries having identical priority will be entries having the same number and location of actively masked bits therein. The MBL constraint will be more fully illustrated by a number of examples.

As a first example, preferred CAM devices may identify a single best match between an 8-bit data string {01100010} applied to a non-sectored CAM array (with actively masked bits shown by "X"), when the entries within the CAM array are arranged randomly (from a priority standpoint) as illustrated by TABLE 1. There are eight (8) columns within the CAM array illustrated by TABLE 1, with column 7 representing the most significant column and column 0 representing the least significant column. As will be understood by those skilled in the art, the leftmost column of an array need not necessarily represent the most significant (or least significant) column. The entries at rows 1, 4 and 5 are the highest priority entries with no actively masked bits and the entries at rows 0 and 6 are the second highest priority entries with only one actively masked bit. The entry at row

TABLE 1

| CAM Address | Column | | | | | | | | Result |
|---|---|---|---|---|---|---|---|---|---|
| (Row) | 7 | 6 | 5 | 4 | 3 | 2 | 1 | 0 | |
| 0 | 0 | 1 | 1 | 0 | 0 | 0 | 1 | X | MATCH |
| 1 | 0 | 0 | 0 | 1 | 1 | 0 | 0 | 1 | MISS |
| 2 | 1 | 1 | 1 | 0 | X | X | X | X | MISS |
| 3 | 0 | 1 | 1 | 0 | X | X | X | X | MATCH |
| 4 | 0 | 1 | 1 | 0 | 0 | 0 | 1 | 0 | BEST MATCH |
| 5 | 1 | 1 | 0 | 1 | 1 | 1 | 0 | 1 | MISS |
| 6 | 1 | 0 | 0 | 1 | 1 | 0 | 0 | X | MISS |
| 7 | 0 | 1 | X | X | X | X | X | X | MISS |

The applied 8-bit data string {01100010} results in the detection of three (3) matches when a compare operation is performed on the CAM entries illustrated by TABLE 1. These three matches occur at rows 0, 3 and 4, with the best match occurring at row 4. As will be understood by those skilled in the art, the best match at row 4 may also be referred to as a longest prefix match (LPM), because it is the match having the fewest number of masked bits when all masked bits in each entry, if any, are located at a rightmost column of the CAM array or are separated from the rightmost column only by one or more actively masked bits within the entry. If the applied 8-bit data string is changed to {01100000}, then the entry at row 7, with six (6) masked bits, will represent the only match and, therefore, the longest prefix match within the array. If the masked bits start and build out from a leftmost column of the CAM array, then longest suffix matches (LSM) may be determined when data is applied to the CAM array. As described herein and in the claims, the phrase "longest prefix match" is intended to cover both leftmost and rightmost locations of actively masked bits (i.e., LPMs and LSMs).

CAM devices according to embodiments of the present invention may also identify best matches when the entries within a CAM array have no (or only some) masked bits in the leftmost or rightmost columns. For example, the preferred CAM devices may identify a single best match between an 8-bit data string {01100010} applied to a non-sectored random entry CAM array, when the entries within the CAM array are arranged randomly by row, as illustrated by TABLE 2. Nonetheless, each of these entries is preferably subject to the masked bit location (MBL) constraint described above in order to achieve more highly integrated arrays and enable highly efficient compare operations.

TABLE 2

| CAM Address | Column | | | | | | | | Result |
|---|---|---|---|---|---|---|---|---|---|
| (Row) | 7 | 6 | 5 | 4 | 3 | 2 | 1 | 0 | |
| 0 | 1 | 1 | 1 | 0 | 0 | 0 | 1 | 0 | MISS |
| 1 | 1 | 1 | 1 | 0 | 0 | 0 | 1 | 0 | MISS |
| 2 | 1 | 1 | 1 | 0 | 1 | 0 | 1 | 1 | MISS |
| 3 | 0 | 1 | X | X | 0 | 0 | 1 | 0 | MATCH |
| 4 | 0 | 1 | X | X | X | 0 | 1 | 1 | MISS |
| 5 | 1 | 1 | X | 1 | 1 | 1 | 0 | 1 | MISS |
| 6 | 1 | 0 | 0 | 1 | 1 | 0 | 0 | 1 | MISS |
| 7 | 0 | 1 | X | 0 | 0 | 0 | 1 | 0 | BEST MATCH |

The applied 8-bit data string {01100010} results in the detection of two (2) matches when a compare operation is performed on the CAM entries illustrated by TABLE 2. These two matches occur at rows 3 and 7, with the best match, having only one masked bit, occurring at row 7.

Preferred CAM devices may also identify best matches when the entries within a CAM array have spaced groups of masked bits and multiple strings of unmasked bits. For example, CAM devices may identify a single best match between an 8-bit data string {01100010} applied to a non-sectored random entry CAM array, when the entries within the CAM array are arranged randomly by row and subject to the MBL constraint, as illustrated by TABLE 3.

TABLE 3

| CAM Address | Column | | | | | | | | Result |
|---|---|---|---|---|---|---|---|---|---|
| (Row) | 7 | 6 | 5 | 4 | 3 | 2 | 1 | 0 | |
| 0 | 1 | 1 | 1 | 0 | 0 | 0 | 1 | 0 | MISS |
| 1 | 0 | 0 | 0 | 1 | 1 | 0 | 0 | 1 | MISS |

TABLE 3-continued

| CAM Address | Column | | | | | | | | Result |
|---|---|---|---|---|---|---|---|---|---|
| (Row) | 7 | 6 | 5 | 4 | 3 | 2 | 1 | 0 | |
| 2 | 1 | 1 | 1 | 0 | 1 | 0 | 1 | 1 | MISS |
| 3 | 0 | 1 | X | X | 0 | X | X | 0 | MATCH |
| 4 | 0 | 1 | X | X | 0 | 0 | 1 | 1 | MISS |
| 5 | 1 | 1 | X | 1 | 1 | 1 | 0 | 1 | MISS |
| 6 | 0 | 1 | X | X | 0 | X | 1 | 0 | BEST MATCH |
| 7 | 0 | 1 | X | 1 | 0 | 0 | 1 | 0 | MISS |

The applied 8-bit data string {01100010} results in the detection of two (2) matches when a compare operation is performed on the CAM entries illustrated by TABLE 3. These two matches occur at rows 3 and 6, with the best match, having a total of three masked bits, occurring at row 6. The examples illustrated by TABLES 1–3 assume a compare operation having at least two distinct phases is performed in accordance with the operations described herein. It will be understood, however, that a single phase compare operation can be performed to identify an entry (or entries) that represents a best match, without initially identifying multiple matching entries having different priority.

Referring now to FIG. 3, a block diagram of a content addressable memory (CAM) array according to one embodiment of the present invention includes an array of memory cells. This array of memory cells may be arranged as a plurality of rows 310 (or row segments) of memory cells and a plurality of columns of memory cells that are electrically coupled to a respective plurality of data lines. As described herein, the references to "rows" of CAM cells include full-width rows and partial-width row segments that may span only a relatively few columns within a CAM array. The rows of cells are illustrated as extending horizontally across the array and columns of cells are illustrated as extending vertically down the array. The data lines may be configured as a plurality of pairs of differential data lines and may be electrically coupled to data line driver devices (not shown) that drive the differential data lines with complementary data (DATA, DATAB), in response to data applied to a CAM device. In the event the CAM array has a width of 72 bits (e.g., 72 columns), the pairs of differential data lines may extend from a leftmost pair of data lines that receive a first pair of complementary data bits (shown as Data Bit 0) to a rightmost pair of data lines that receive a last pair of complementary data bits (shown as Data Bit 71). The CAM array may be capable of retaining 64K entries that are each 72 bits wide, as illustrated. CAM arrays having alternative configurations and data capacity are also possible.

The CAM array may include a ternary memory cell 302 in each bit location defined by a particular row and column. As will be understood by those skilled in the art, a ternary memory cell may operate as a ternary storage unit that retains binary data information (D=0 or 1) and mask information (M). When the mask information indicates an active mask bit, the ternary memory cell may be treated as storing a don't care value (X), irrespective of the value of the binary data information. CAM arrays may also include a combination of ternary cells (or higher content memory cells) that each retain data and mask information and binary cells that retain solely data information and no mask information. For example, the CAM array may be configured so that one or more leftmost columns within the CAM array include ternary cells and one or more rightmost columns include binary cells (or vice versa). Other configurations of cells and cell types are also possible. The CAM array may also include a data comparison circuit that comprises a plurality of comparison units 304. As illustrated, each comparison unit 304 is connected to a respective ternary memory cell 302 in the CAM array. Each comparison unit 304 is illustrated as receiving a data bit (D) and a mask bit (M) retained by a respective memory cell 302 and a data bit provided by a data line. During a compare operation, these received data and mask bits are used to determine a presence of a miss, match or don't care condition (which is treated as a match condition). Each comparison unit 304 and respective ternary memory cell 302 collectively form a preferred CAM cell 300 within the CAM array.

As illustrated and described more fully hereinbelow with respect to FIGS. 4–5, each comparison unit 304 within a respective row (or row segment) may have an output that is electrically connected to a corresponding match line 312 and a terminal that is electrically connected to a Wired-AND masked cell disable signal line 314. Each match line 312 may constitute a Wired-AND match line that is precharged high prior to (or after) commencement of a compare operation. Each Wired-AND match line 312 may be broken into a plurality of segments that are joined using conventional circuitry. For example, if a 72-bit wide compare operation is performed as a sequence of x6, x12 and x54 segment compare operations, a first segment of each Wired-AND match line within the array may be only 6-bits wide. The construction, operation and layout of Wired-AND match lines are well known to those skilled in the art and need not be described more fully herein. Match lines that do not require precharging, such as match lines that "float" high or are configured as a 72-bit AND gate, may also be used. Match lines that "float" high may utilize voltage, current or resistive charging.

The preferred CAM cells 300 may identify a best match in one or two phases during a compare operation. In some applications, a best match may constitute a longest prefix match. The compare operation may comprise a single phase or multiple phase operation. During a two-phase compare operation, an operation is first performed to identify a first plurality of matches between data bits applied to the plurality of pairs of data lines and data stored with or without active mask bits as entries within the CAM array, with each entry comprising an entire row of data or data within a corresponding row segment. After a first plurality of matches are initially identified, then one or more of the first plurality of matches that do not represent a longest prefix match or, more generally, do not represent a best match, are eliminated. This second elimination phase of the compare operation may be performed in-sync with a leading edge of a delayed enable signal that may be asserted a predetermined amount of time after new data is applied to the CAM array and the compare operation is commenced. This operation to eliminate one or more of the first plurality of matches may include blocking at least one CAM cell associated with an identified match from indicating a cell match condition. According to a preferred aspect of this embodiment of FIG. 3, the CAM array identifies a longest prefix match (or best match) by blocking at least one actively masked CAM cell in a matching entry from indicating a cell match condition. In particular, the CAM array may force the actively masked CAM cell associated with a matching entry to indicate a cell miss during a compare operation, irrespective of whether the actively masked CAM cell is actually storing a matching data bit. These operations will now be more fully described with respect to the other illustrated embodiments of the present invention.

Referring now to FIG. 4, a preferred CAM array that can identify a best match(es) during a compare operation includes an array of CAM cells 400 having a plurality of rows 410 of CAM cells 400 therein. Like the embodiment of FIG. 3, the CAM array is illustrated as being 72 bits wide and 64K entries deep. Each CAM cell 400 is illustrated as comprising a ternary memory cell and a comparison unit. The ternary memory cell may be of conventional design and may include circuitry that performs the function of two D-type flip-flops 402 and 403. The flip-flops 402 and 403 within a CAM cell 400 can be loaded with data and mask bits by driving the enable inputs (E) of each flip-flop high. For example, new data may be written into the entry bit flip-flop 402 of the top leftmost CAM cell 400 in the CAM array by applying new data to the first data line (Data Bit 0) and driving both the entry enable signal line (Entry Enable) and the first address signal line 424 (Addr 0) high to latch in the new data. Similarly, an active mask bit can be written into the mask bit flip-flop 403 of the top leftmost CAM cell 400 in the CAM array by applying the mask data to the first data line (Data Bit 0) and driving both the mask enable signal line (Mask Enable) and the first address signal line (Addr 0) high to latch in the mask data. Complementary data lines (not shown) are also typically provided. These operations for loading data and mask bits are conventional write operations and need not be described further herein. Nonetheless, to improve performance of the CAM arrays described herein, the writing operations are preferably subject to the masked bit location (MBL) constraint. This MBL constraint may be achieved if for every new entry having at least one actively masked bit, any and all other searchable entries in the CAM array that have the same or fewer number of actively masked bits have each of their actively masked bits in a location (e.g., column) that overlaps with a location of an actively masked bit in the new entry.

The comparison unit within each CAM cell 400 may include circuitry (e.g., transistors) therein that performs the same boolean functions as the illustrated logic gates 404–408. These logic gates are illustrated for ease of understanding and should not be interpreted as limiting the invention to the specific logic gate implementation that is illustrated and described herein. The logic gates include a 2-input XOR gate 404, a first AND gate 405 having a true and inverted input, a second AND gate 406, a three-input NAND gate 407 and a 2-input OR gate 408,having an output that can be operated with a Wired-AND match line 412. In one embodiment, each NAND gate 407 within a comparison unit has an input that is responsive to an active high delayed enable signal (Delayed Enable), which is held inactive during a first phase of a compare operation. The three-input NAND gate 407 may have characteristics that enable its output to be connected to outputs of other NAND gates 407, within the same column, in a Wired-AND configuration. In particular, NAND gates 407 within the same column of CAM cells 400 have outputs that are connected together by a respective Wired-AND masked cell disable signal line 414 (shown as Masked Cell Disable 0–71). The 2-input XOR gate 404 has a first input connected to a complementary output 0 of the entry bit flip-flop 402 and a second input connected to a respective true data line. Whenever the applied data on the true data line matches the data bit stored within the entry bit flip-flop 402, the output of the 2-input XOR gate 404 will be held high at a logic 1 level to indicate a data bit match condition. If the applied data does not match the data bit stored within the CAM cell 400, the output of the XOR gate 404 will be held low.

When the mask bit flip-flop 403 is loaded with an active mask bit, the true output Q of the mask bit flip-flop 403 will be set high and the CAM cell 400 will be treated as being actively masked and storing a don't care (X) value. If the true output Q of the mask bit flip-flop 403 is set high, then the output of the first AND gate 405 will be held low, even if the output of the XOR gate 404 indicates a data bit match condition. In other words, the status of a data bit match at the output of the XOR gate 404 will be ignored. If the output of the three-input NAND gate 407 is maintained at a logic 1 level (e.g., a precharged level) because the delayed enable signal (Delayed Enable) is inactive at a logic 0 level, then the true output Q of the mask bit flip-flop 403 will be passed as a high value to the output of the second AND gate 406. A high value at the output of the second AND gate 406 will cause the CAM cell 400 to indicate a cell match condition at the output of the 2-input OR gate 408, irrespective of whether the data bit stored by the entry bit flip-flop 402 matches the applied data bit. In contrast, when the mask bit flip-flop 403 is loaded with an inactive mask bit, the true output Q of the mask bit flip-flop 403 will be set low and the CAM cell 400 will be treated as being unmasked. If the true output Q of the mask bit flip-flop 403 is set low, then the output of the first AND gate 405 will track the output of the XOR gate 404 and the output of the second AND gate 406 will be held low. Accordingly, when the CAM cell 400 is unmasked, the output of the first AND gate 405 and the output of the 2-input OR gate 408 will track the output of the XOR gate 404. This means a cell match condition will exist in the CAM cell 400 when the applied data bit matches the data bit stored by the entry bit flip-flop 402 and a cell miss condition will exist in the CAM cell 400 when the applied data bit does not match the data bit stored by the entry bit flip-flop 402.

In one embodiment of the present invention, prior to commencement of a compare operation, the match lines 412 and the masked cell disable signal lines 414 are precharged high. Then, during a first phase of a compare operation, when the active high delayed enable signal lines (Delayed Enable) are low, the masked cell disable signal lines 414 remain high because each NAND gate 407 will be receiving at least one logic 0 input. However, the match line 412 associated with the first row (or row segment) of CAM cells will remain high at its precharged level only if the unmasked bits of the first data entry stored in the first row (or row segment) matches the data applied to the corresponding data lines. However, if any data bit associated with an unmasked CAM cell 400 within the first row does not match the corresponding applied data bit, then both inputs to the 2-input OR gate 408 within the CAM cell 400 will be set low and the output of the 2-input OR gate 408 will pull the corresponding match line 412 low to indicate an entry miss condition.

If, for purposes of illustration, the applied data equals {1010} and the CAM array is 4 bits wide and contains only two rows with entries {101X} and {10XX} in the first and second rows, respectively, then during the first phase of a compare operation, the match lines associated with the first and second rows will both remain high at their respective precharged levels. Thus, during the first phase of the compare operation, two entries within the CAM array will be identified as indicating a match condition. Each of the four Wired-AND masked cell disable signal lines 414 (Masked Cell Disable 0–3) will also remain high at a precharged level because an inactive low delayed enable signal (Delayed Enable) will restrict the 3-input NAND gates 407 from discharging the precharged high voltage present at their outputs. Restricting the outputs of each of the 3-input NAND gates 407 from pulling low will enable the second AND gate 406 in each CAM cell 400 to pass any active mask bit as a logic 1 value to the input of the 2-input OR gate 408 and thereby indicate a cell match condition.

Next, during a second phase of the compare operation, which is triggered in-sync with a leading edge of the active high delayed enable signal (Delayed Enable), the first matching entry {101X} associated with the first row of CAM cells 400 will beat out the second matching entry {10XX} associated with the second row of CAM cells 400 as the best match (and longest prefix match in this example) because it has a lesser number of actively masked bits. In particular, during the second phase of the compare operation, the second matching entry {10XX} will produce a miss condition because the output of the 3-input NAND gate 407 associated with the third leftmost bit of the first row entry will pull its associated Wired-AND masked cell disable signal line 414 (e.g., Masked Cell Disable 2) low. This pull-down operation will force a low signal on the input of the second AND gate 406 associated with the third leftmost bit entry in the second row. This low signal has the effect of blocking the third leftmost masked bit of the second row entry from indicating a cell match condition. Accordingly, during the second phase of the compare operation, a competition takes place between all the matching entries and only the matching entry having the fewest number of actively masked bits will win the competition and be treated as a best match, in this case, a longest prefix match. In some cases, multiple best matches may be present and of these matches will win the competition over all other lower priority matches. Although not shown, circuitry internal or external to the CAM array may communicate a multiple best match condition to a user so that unnecessary duplicate entries can be eliminated (e.g., written over with new entries).

This operation to cause the CAM cell 400 associated with the third leftmost bit in the second row to disregard its actively masked bit occurs in-sync with a falling edge of the third leftmost masked cell disable signal (i.e., on Masked Cell Disable-2 signal line 414) associated with the third column. This falling edge on the third leftmost masked cell disable signal line 414 -S (Masked Cell Disable-2) is triggered by the high-to-low switching of the output of the 3-input NAND gate 405 associated with the third leftmost CAM cell 400 in the first row of the array, which is storing a 1 data bit. This high-to-low switching at the output of the 3-input NAND gate 405 associated with the third leftmost CAM cell 400 in the first row of the CAM array occurs when all three inputs to this NAND gate 405 achieve a high level. This high level status of the three inputs is achieved when (i) the delayed enable signal (Delayed Enable) is switched low-to-high, (ii) the entire entry represents a match condition and (iii) the data bit in the corresponding CAM cell indicates a bit match with the corresponding applied data bit (i.e., output of XOR gate 404 is high). To limit the number of loads per driver, the CAM array can be divided into blocks (e.g., 4K rows per block) with amplifying bridges between the blocks for passing the delayed enable signal and the masked cell disable signal.

Based on the above-described operations, a cell miss condition and, therefore, an entry miss condition, will exist whenever (i) a CAM cell is unmasked and the stored data bit does not equal the corresponding applied data bit or (ii) a CAM cell is actively masked, but the active mask is blocked by the second AND gate 406 when the respective masked cell disable signal line is pulled low. This latter condition is treated herein as a cell miss even if the applied data bit matches the corresponding data bit stored within the CAM cell and the output of the XOR gate 404 is held high to thereby indicate a data bit match condition.

The above-described 2-phase compare operation will also detect a best match that is not a longest prefix match. For example, FIG. 6 illustrates application of the preferred 2-phase compare operation on a non-sectored CAM array having multiple groups of actively masked bits that can be randomly entered on a row basis. These masked bits are nonetheless preferably subject to the above-described MBL constraint. In the example of FIG. 6, only columns 0–4, 7–8 and 14–15 may contain actively masked CAM cells and no two entries may have the same number of actively masked bits unless their masked bits are in the same column locations. During the first phase of the compare operation, the data entries of rows 8 and 10 are identified as matches, with all other entries indicating a miss. Then, because the matching entry at row 10 has fewer actively masked bits relative to the matching entry at row 8, the second phase of the compare operation will cause the matching entry at row 8 to be treated as indicating a miss. Conventional techniques and priority encoding circuitry coupled to the CAM array can then be used to provide an address of row 10 to external circuitry (not shown).

FIG. 7 illustrates application of the preferred 2-phase compare operation with a CAM array to determine longest prefix matches (LPMs). In the example of FIG. 7, only columns 0–3 may contain actively masked CAM cells. In addition to the MBL constraint, a further constraint is provided that requires all actively masked CAM cells in the CAM array to be located at a rightmost column of the CAM array or be separated from the rightmost column only by one or more actively masked CAM cells. During the first phase of the compare operation, the data entries of rows 8 and 10 are identified as matches, with all other entries indicating a miss. Then, because the matching entry at row 10 has fewer actively masked bits relative to the matching entry at row 8, the second phase of the compare operation will cause the matching entry at row 8 to be treated as indicating a miss.

Referring now to FIG. 5, another preferred CAM array that can identify a best match(es) during a compare operation includes an array of CAM cells 400'. The CAM cells 400' are similar to the CAM cells 400 illustrated by FIG. 4, but do not require the use of a 3-input NAND gate 407 and do not require that the compare operation be performed in two phases, with the first phase identifying matching entries and the second phase eliminating those matching entries that do not represent a best match. In particular, the CAM array of FIG. 5 need not be responsive to a delayed enable signal in the event the match lines 412' utilize a continuous float-high mechanism or are implemented as a multi-input AND gate that spans a respective row or row segment (e.g., 72-input AND gate). A continuous float-high mechanism may be achieved using voltage, current and resistive charging of the match lines 412'. In another aspect of this embodiment, the match lines 412' could be precharged low prior to each compare operation and then held low until after all the inputs and outputs of the logic gates (or transistors that perform the boolean function of the logic gates) within each CAM cell 400' have settled. Then, after a sufficient time to enable settling, the match lines 412' are precharged. The operation of the CAM array of FIG. 5 is otherwise similar to the operation of the CAM array of FIG. 4, because it uses a respective masked cell disable signal line for each column (Masked Cell Disable 0–71) to preclude entries that match from registering as matches during a compare operation if another matching entry within the CAM array has a fewer number of actively masked bits. If another matching entry within the CAM array has a fewer number of actively masked bits (i.e., has higher priority), then the outputs of all NAND gates 407' associated with the unmasked bits in a higher priority matching entry will pull low and pull their respective masked cell disable signal lines low. At least one of the masked cell disable lines that are pulled low will knock out another matching entry having a greater number of actively masked bits from contention as a best match and will cause this lower priority matching entry to be interpreted as a miss by pulling its respective match line low. Thus, if the CAM array of FIG. 5 is three bits wide and has only two matching entries of different priority, then only the highest priority matching entry will be detected as a best match. For example, if the applied data is represented as {101} and the first and second entries in the CAM array retain {X01} and {XX1}, respectively, then the matching second bit in the first entry, shown as 0, will cause the second leftmost bit in the second entry (which is masked) to be interpreted as a cell miss. This miss condition is achieved by causing the second AND gate 406 within the second CAM cell 400' in the second entry to block the active mask bit therein from being passed as a logic 1 value from the true output Q of the corresponding mask bit flip-flop 403 to the input of the corresponding OR gate 408. The best match condition (and longest suffix match condition in this example) is thereby established by causing all other lower priority matching entries to indicate a miss during a single-phase compare operation.

The operations described above with respect to the CAM arrays of FIGS. 3–5 can be used by a ternary CAM device to identify a longest prefix match (LPM) for an input key when the entries within the CAM are stored randomly. Routers that use destination addresses (DA) of incoming packets to find out where to forward the packet can use the destination address as an input to a CAM device. The CAM array compares the DA against all of its entries looking for matches. If multiple matches are found, then the preferred CAM array finds the entry having the longest prefix match internally. The location of this LPM entry is then encoded and provided as an output from the CAM for supporting the router's packet forwarding process.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A content addressable memory (CAM) device, comprising:
   a CAM array that is configured to identify a best match between a data comparand applied to said CAM array and a plurality of matching entries therein, by blocking at least one actively masked CAM cell in a row containing a first one of the plurality of matching entries from indicating a cell match condition when the first one of the plurality of matching entries is compared to the applied data comparand during a compare operation, said at least one actively mask CAM cell having a valid data bit therein that matches a corresponding bit of the applied data comparand.

2. The device of claim 1, wherein said CAM array is configured to identify a best match by blocking the at least one actively masked CAM cell in the row from indicating a cell match condition during the compare operation when all other unmasked CAM cells in the same row are indicating a cell match condition with the applied data comparand.

3. The device of claim 1, wherein entries in said CAM array containing actively masked bits meet a masked bit location constraint.

4. The device of claim 3, wherein the masked bit location constraint requires that for every individual entry in said CAM array having at least one actively masked bit, all other entries in said CAM array having the same or fewer number of actively masked bits have each of their actively masked bit(s) in a respective location that overlaps a location of an actively masked bit in the individual entry.

5. A content addressable memory (CAM) device, comprising:
a CAM array that identifies a best match between data applied to said CAM array and a plurality of data entries therein during a compare operation, by internally blocking all lower priority matching data entries from indicating a match condition whenever a higher priority matching data entry is present, said CAM array comprising a plurality of Wired-AND masked cell disable signal lines that are each electrically coupled to a plurality of CAM cells within a respective column of CAM cells.

6. A content addressable memory (CAM) array, comprising:
a CAM array having a plurality of ternary CAM cells therein that are configured to identify one matching entry having a longest prefix match from a plurality of matching entries during a search operation by causing another one of the plurality of matching entries that does not represent a longest prefix match to indicate a miss condition on its corresponding match line during the search operation;
wherein said CAM array is responsive to a delayed enable signal; and
wherein the corresponding match line is pulled high-to-low in-sync with a leading edge of the delayed enable signal during the search operation.

7. The CAM device of claim 6, wherein said CAM array comprises a plurality of binary CAM cells and a plurality of ternary CAM cells therein.

8. A content addressable memory (CAM) device, comprising:
a ternary CAM array that is configured identify a first matching entry having a longest prefix from a plurality of second matching entries having shorter prefixes during a search operation, by causing a row of CAM cells associated with a second matching entry to indicate a miss condition on its corresponding match line when a data value stored within the row of CAM cells is compared to a matching data comparand during the search operation, said row of CAM cells comprising an actively mask CAM cell having a valid data bit therein that matches a corresponding bit of the matching data comparand.

9. The CAM device of claim 8, wherein the search operation is performed in the absence of comparing the longest prefix to mask bits in the first and second matching entries.

10. The CAM device of claim 8, wherein said ternary CAM array is responsive to a delayed enable signal; and wherein a match line associated with the row of CAM cells is pulled high-to-low in-sync with a leading edge of the delayed enable signal during the search operation.

11. The CAM device of claim 8, wherein said ternary CAM array comprises a plurality of Wired-AND masked cell disable signal lines that are each electrically coupled to a plurality of CAM cells within a respective column of CAM cells.

12. A content addressable memory (CAM) device, comprising:
a ternary CAM array that is configured identify a first matching entry having a longest prefix from a plurality of second matching entries having shorter prefixes during a search operation, by causing a row of CAM cells associated with a second matching entry to indicate a miss condition on its corresponding match line in the absence of comparing the longest prefix to mask bits in the second matching entry.

13. The CAM device of claim 12, wherein said ternary CAM array comprises a plurality of lired-AND masked cell disable signal lines that are each electrically coupled to a plurality of CAM cells within a respective column of CAM cells.

14. A content addressable memory (CAM) device, comprising:
a ternary CAM array that is configured identify a first matching entry having a longest prefix from a plurality of second matching entries having shorter prefixes during a search operation, by causing all rows of CAM cells associated with the plurality of second matching entries to pull their respective match lines high-to-low during a search operation that is devoid of an operation to compare the longest prefix to mask bits in the plurality of second matching entries.

15. The CAM device of claim 14, wherein said ternary CAM array comprises a plurality of Wired-AND masked cell disable signal lines that are each electrically coupled to a plurality of CAM cells within a respective column of CAM cells.

16. The CAM device of claim 15, wherein the match lines associated with the second matching entries are pulled high-to-low in-sync with a leading edge of a delayed enable signal.

17. The CAM device of claim 14, wherein the match lines associated with the second matching entries are pulled high-to-low in-sync with a leading edge of a delayed enable signal.

* * * * *